United States Patent
Okita et al.

(10) Patent No.: US 12,165,845 B2
(45) Date of Patent: Dec. 10, 2024

(54) PLASMA PROCESSING APPARATUS AND METHOD FOR USING PLASMA PROCESSING APPARATUS

(71) Applicant: Panasonic Intellectual Property Management Co., Ltd., Osaka (JP)

(72) Inventors: Shogo Okita, Hyogo (JP); Yoshiyuki Wada, Osaka (JP); Takahiro Miyai, Osaka (JP); Naoaki Takeda, Osaka (JP); Toshihiro Wada, Osaka (JP); Toshiyuki Takasaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 216 days.

(21) Appl. No.: 18/056,294

(22) Filed: Nov. 17, 2022

(65) Prior Publication Data
US 2023/0170186 A1    Jun. 1, 2023

(30) Foreign Application Priority Data
Nov. 30, 2021   (JP) ................................. 2021-194145

(51) Int. Cl.
 H01J 37/32    (2006.01)
(52) U.S. Cl.
 CPC .. H01J 37/32266 (2013.01); H01J 37/32449 (2013.01); *H01J 2237/141* (2013.01)
(58) Field of Classification Search
 None
 See application file for complete search history.

(56) References Cited

U.S. PATENT DOCUMENTS

| | | | | |
|---|---|---|---|---|
| 7,476,301 | B2* | 1/2009 | Weichart | H01J 37/3266 204/192.13 |
| 8,613,828 | B2* | 12/2013 | Weichart | H01J 37/321 118/723 AN |
| 9,039,864 | B2* | 5/2015 | Baek | H01J 37/32174 156/345.43 |
| 9,613,825 | B2* | 4/2017 | Shaviv | H01L 21/31138 |
| 10,672,595 | B2* | 6/2020 | Ohmori | H01J 37/32926 |
| 2003/0075522 | A1* | 4/2003 | Weichart | H01J 37/3266 216/2 |

(Continued)

FOREIGN PATENT DOCUMENTS

JP    2013-012761 A    1/2013

*Primary Examiner* — Srinivas Sathiraju
(74) *Attorney, Agent, or Firm* — PEARNE & GORDON LLP (57) ABSTRACT

Disclosed is a plasma processing apparatus 10 including a chamber 11, a stage 12, a dielectric member 13, a cover 14, a gas introduction path 15, and an induction coil 16. The induction coil 16 includes a first induction coil 17 installed so as to overlap a central region R1 of the dielectric member 13, and a second induction coil 18 installed so as to overlap a peripheral region R2 outside the central region R1 of the dielectric member 13. The cover 14 has a first gas hole 14c formed at a position overlapping the central region R1 and a second gas hole 14d formed at a position overlapping the peripheral region R2. The gas introduction path 15 has a first gas introduction path 15a communicating with the first gas hole 14c and a second gas introduction path 15b communicating with the second gas hole 14d.

10 Claims, 7 Drawing Sheets

(56) References Cited

U.S. PATENT DOCUMENTS

| | | | | |
|---|---|---|---|---|
| 2005/0042869 A1* | 2/2005 | Ohmi | ............. | H01L 21/318 |
| | | | | 257/E21.267 |
| 2009/0130335 A1* | 5/2009 | Okumura | ............. | H01J 37/321 |
| | | | | 427/569 |
| 2009/0233430 A1* | 9/2009 | Hirano | ............. | H01L 21/02148 |
| | | | | 118/723 R |
| 2009/0255901 A1* | 10/2009 | Okita | ............. | H01J 37/32706 |
| | | | | 118/728 |
| 2010/0096088 A1* | 4/2010 | Okita | ............. | H01J 37/321 |
| | | | | 156/345.48 |
| 2010/0173431 A1* | 7/2010 | Okita | ............. | H01L 21/02032 |
| | | | | 257/E21.24 |
| 2011/0111601 A1* | 5/2011 | Okita | ............. | H01L 21/67069 |
| | | | | 156/345.24 |
| 2012/0006489 A1* | 1/2012 | Okita | ............. | H01L 21/68742 |
| | | | | 156/345.43 |
| 2018/0269042 A1* | 9/2018 | Ohmori | ............. | H01J 37/32926 |
| 2019/0131112 A1* | 5/2019 | Ma | ............. | H01J 37/32449 |
| 2022/0208523 A1* | 6/2022 | Long | ............. | H01J 37/32651 |
| 2023/0170186 A1* | 6/2023 | Okita | ............. | H01J 37/32449 |
| | | | | 315/111.21 |

\* cited by examiner

PLASMA PROCESSING APPARATUS AND METHOD FOR USING PLASMA PROCESSING APPARATUS

CROSS REFERENCE TO RELATED APPLICATION

The present application is based on and claims priority under 35 U.S.C. § 119 with respect to the Japanese Patent Application No. 2021-194145 filed on Nov. 30, 2021, of which entire content is incorporated herein by reference into the present application.

TECHNICAL FIELD

The present disclosure relates to a plasma processing apparatus and a method for using a plasma processing apparatus.

BACKGROUND

Conventionally, a plasma processing apparatus that performs plasma processing on an object to be processed has been known as disclosed in Patent Literature 1 (JP2013-012761A). The plasma processing apparatus of Patent Literature 1 includes a chamber having an opening at the top, a stage which is provided in the chamber and on which an object to be processed is placed, a dielectric member closing the opening, and a gas introduction path for introducing a source gas into the chamber, and an induction coil configured to generate a plasma containing the source gas in the chamber. The induction coil has a first induction coil provided on the central side and a second induction coil provided on the outer peripheral side.

However, there is a room for improvement in the plasma processing apparatus of Patent Literature 1, in terms of the uniformity of the etching rate of the object to be processed (i.e., the uniformity of the speed at which the surface of the object to be processed is plasma-etched). For making the etching rate more uniform, it is effective to control the electron density distribution and the radical density distribution in the chamber. Under such circumstances, one of the aims of the present disclosure is to control the electron density distribution and the radical density distribution in the chamber.

SUMMARY

One aspect of the present disclosure relates to a plasma processing apparatus. The plasma processing apparatus includes: a chamber having an opening at a top; a stage provided in the chamber, the stage for placing an object to be processed; a dielectric member closing the opening; a cover installed so as to cover the dielectric member inside the chamber; a gas introduction path for introducing a source gas, the gas introduction path formed between the dielectric member and the cover; and an induction coil provided above the dielectric member and configured to, when applied with a high-frequency power, generate a plasma containing the source gas in the chamber, the induction coil including a first induction coil installed so as to overlap a central region of the dielectric member, and a second induction coil installed so as to overlap a peripheral region outside the central region of the dielectric member, the cover having a first gas hole formed at a position overlapping the central region of the dielectric member and a second gas hole formed at a position overlapping the peripheral region of the dielectric member, the gas introduction path having a first gas introduction path communicating with the first gas hole and a second gas introduction path communicating with the second gas hole.

Another aspect of the present disclosure relates to a method for using a plasma processing apparatus. The method is for using a plasma processing apparatus including: a chamber having an opening at a top; a stage provided in the chamber, the stage for placing an object to be processed; a dielectric member closing the opening; a cover installed so as to cover the dielectric member inside the chamber; a gas introduction path formed between the dielectric member and the cover; and an induction coil provided above the dielectric member, the induction coil including a first induction coil installed so as to overlap a central region of the dielectric member, and a second induction coil installed so as to overlap a peripheral region outside the central region of the dielectric member, the cover having a first gas hole formed at a position overlapping the central region of the dielectric member and a second gas hole formed at a position overlapping the peripheral region of the dielectric member, the gas introduction path having a first gas introduction path communicating with the first gas hole and a second gas introduction path communicating with the second gas hole. The method includes generating a plasma containing a source gas in the chamber, by introducing the source gas into the first and second gas introduction paths and applying a high-frequency power to the first and second induction coils.

According to the present disclosure, the electron density distribution and the radical density distribution in the chamber can be controlled.

BRIEF DESCRIPTION OF THE DRAWINGS

FIGS. 6A and 6B show examples of a magnetic flux density simulation result.

FIGS. 7A and 7B show examples of a gas flow simulation result.

DETAILED DESCRIPTION

Embodiments of a plasma processing apparatus and a method for using a plasma processing apparatus according to the present disclosure will be described below by way of examples. It is to be noted, however, that the present disclosure is not limited to the examples described below. In the description below, specific numerical values and materials are exemplified in some cases, but other numerical values and materials may be applied as long as the effects of the present disclosure can be achieved.

(Plasma Processing Apparatus)

A plasma processing apparatus according to the present disclosure is for performing plasma processing on an object to be processed. The plasma processing apparatus may be, for example, a plasma etching apparatus, a plasma dicer, a plasma ashing apparatus, or a plasma CVD apparatus. The plasma processing apparatus includes a chamber, a stage, a dielectric member, a cover, a gas introduction path, and an induction coil.

The chamber has an opening at the top. The chamber may be formed in a hollow cylinder shape. The opening may be open upward.

The stage is provided in the chamber, and an object to be processed is placed thereon. The stage may have a horizontal placement surface for placing the object to be processed. The stage may have a channel for flowing a coolant for cooling the object to be processed during plasma processing. The stage may have an electrostatic chuck system for chucking the object to be processed. The stage may have a lower electrode to be applied with a high-frequency power. The object to be processed may be, for example, a semiconductor substrate to be singulated by plasma etching. The semiconductor substrate includes a plurality of element regions and dicing regions defining the element regions. The element regions include, for example, a semiconductor layer and a wiring layer. By etching the dicing regions, element chips having a semiconductor layer and a wiring layer can be obtained. The object to be processed may be supported on a carrier, and in this state, may be placed on the stage. The carrier may be, for example, a resin sheet with the outer peripheral portion held by a frame.

The dielectric member closes the opening of the chamber. The dielectric member may be formed in a plate shape having a horizontally extending region. The dielectric member may be constituted of, for example, ceramics, such as quartz, alumina, and aluminum nitride. The dielectric member may be mainly constituted of quartz.

The cover is installed so as to cover the dielectric member inside the chamber. The cover has a first gas hole formed at a position overlapping a central region of the dielectric member and a second gas hole formed at a position overlapping a peripheral region outside the central region of the dielectric member. The central region can be defined as a circular region including the center of the dielectric member. The peripheral region can be defined as a first annular region surrounding the central region defined as the circular region. Given that the diameter of the central region defined as the circular region is denoted by d1, the outer diameter d2 of the peripheral region defined as the first annular region may be 2 times or more or 2.5 times or more as large as the d1. Between the circular region and the first annular region, a second annular region facing neither the first gas hole nor the second gas hole may be defined. The first and second gas holes may pierce the cover in the thickness direction. The first and second gas holes may each communicate with a space in the chamber where the stage is provided. A plurality of the first gas holes and a plurality of the second gas holes may be provided. The cover may be constituted of, for example, ceramics, such as quartz, alumina, aluminum nitride, and silicon nitride. The cover may be mainly constituted of aluminum nitride or quartz.

The gas introduction path is formed between the dielectric member and the cover, and a source gas is in introduced therethrough. The gas introduction path has a first gas introduction path communicating with the first gas hole, and a second gas introduction path communicating with the second gas hole. The first and second gas introduction paths may be each constituted of a groove formed in the cover. The source gas introduced into the first gas introduction path is introduced into the chamber through the first gas hole. The source gas introduced into the second gas introduction path is introduced into the chamber through the second gas hole.

The induction coil is provided above the dielectric member, and when applied with a high-frequency power, generates a plasma containing the source gas in the chamber. The induction coil has a first induction coil installed so as to overlap the central region of the dielectric member and a second induction coil installed so as to overlap the peripheral region of the dielectric member. The magnetic field generated by the first induction coil mainly acts on the source gas introduced into the chamber from the first gas hole. The magnetic field generated by the second induction coil mainly acts on the source gas introduced into the chamber from the second gas hole. By adjusting the high-frequency power applied to the first induction coil and the flow rate of the source gas introduced from the first gas hole, and by adjusting the high-frequency power applied to the second induction coil and the flow rate of the source gas introduced from the second gas hole, the electron density distribution and the radical density distribution in the chamber can be flexibly controlled. Through the adjustment as above, the electron density distribution and the radical density distribution in the chamber can be controlled, and the object to be processed can be processed more uniformly.

A first distance between the first gas hole and the first induction coil (e.g., the shortest vertical distance between the two) may be different from a second distance between the second gas hole and the second induction coil (e.g., the shortest vertical distance between the two). According to this configuration, mutual interference is unlikely to occur between the magnetic field generated by the first induction coil and the magnetic field generated by the second induction coil. Therefore, the independent controllability of the first induction coil and the second induction coil can be enhanced. This can further enhance the controllability of the electron density distribution and the radical density distribution in the chamber. The first distance may be larger or smaller than the second distance, but in terms of improving the controllability of the electron density distribution and the radical density distribution, the first distance is preferably larger than the second distance.

The reason will be described below. In order to accurately control the electron density distribution and the radical density distribution in the chamber, the resolution of the first induction coil (i.e., the plasma generation capacity of the first induction coil per unit power applied to the first induction coil) is preferably almost on the same level as that of the second induction coil (i.e., the plasma generation capacity of the second induction coil per unit power applied to the second induction coil). Here, it is assumed that the first induction coil, as compared to the second induction coil, is smaller in coil acting area and short in coil length. In that case, the magnetic field generation efficiency per unit power of the first induction coil when a high-frequency power is applied is higher than that of the second induction coil. The magnetic field of the first induction coil and the magnetic field of the second induction coil each act on the source gas in the chamber, to generate a plasma. The magnetic field weakens with increasing distance from the coil. Therefore, setting the first distance larger than the second distance can reduce the contribution of the magnetic field of the first induction coil to the plasma generation. Hence, by setting the first distance larger than the second distance, mutual interference between the coils can be reduced, and further-more, the plasma generation capacity (resolution) per unit power of the first induction coil can be adjusted almost on the same level as that of the second induction coil. This makes possible an accurate control of the electron density distribution and the radical density distribution.

Figure 6A:
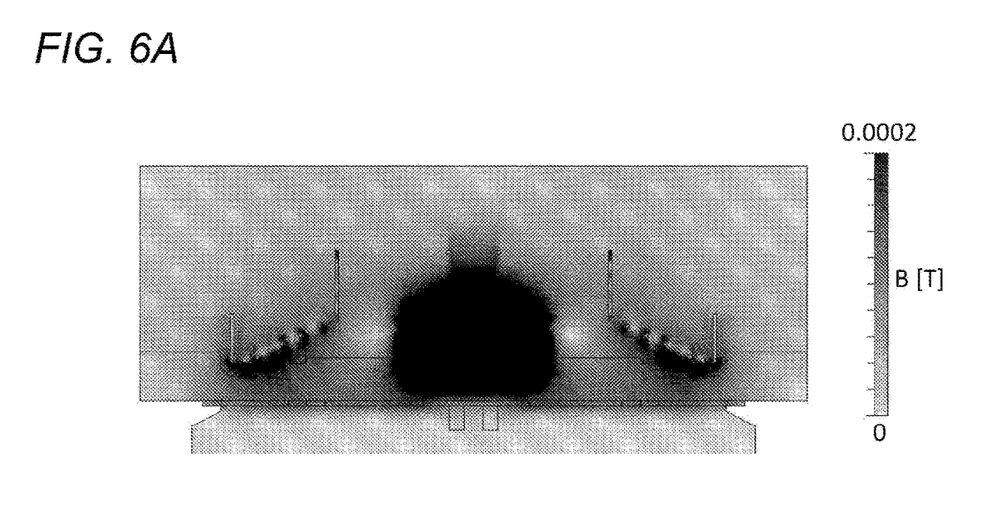
FIG. 6A shows a simulation result when a first distance is greater than a second distance.
Figure 6B:
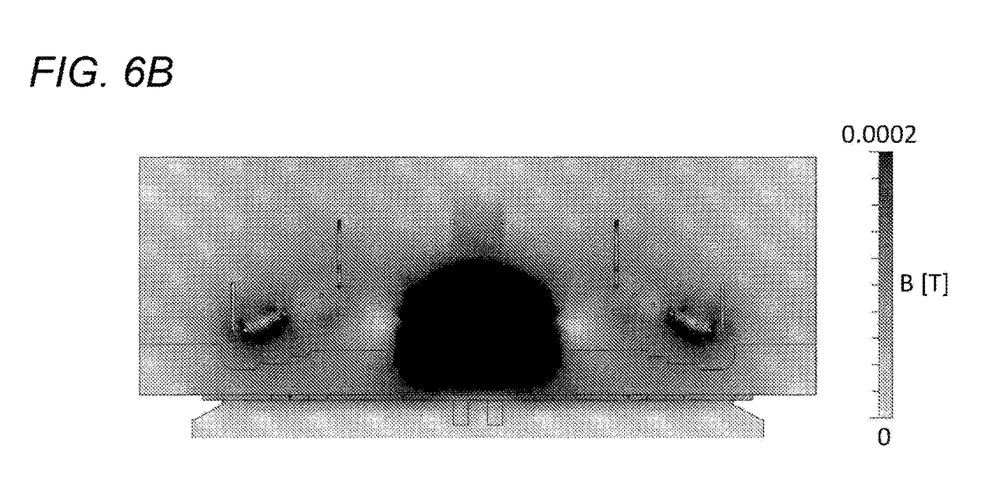
FIG. 6B shows a simulation result when the first distance and the second distance are the same.

Examples of a magnetic flux density simulation result are shown in FIGS. 6A and 6B. FIG. 6A shows a simulation result when the first distance is greater than the second distance. FIG. 6B shows a simulation result when the first distance is the same as the second distance. A comparison between FIG. 6A and FIG. 6B shows that the distribution of magnetic flux density generated by the second induction coil in FIG. 6A spreads more toward the chamber than in FIG. 6B, and a similar level of magnetic flux density to that in the vicinity of the first gas holes can be obtained in the vicinity of the second gas holes. This indicates that when the first distance is greater than the second distance as in FIG. 6A, the controllability of the electron density distribution and the radical density distribution can be improved.

A flow rate of the source gas introduced into the first gas introduction path may be higher than that of the source gas introduced into the second gas introduction path. According to this configuration, the source gas flow from the central side toward the outer peripheral side tends to occur in the chamber. The object to be processed is usually placed in the center area of the chamber and subjected to plasma processing, during which reaction products are generated in the vicinity of the object to be processed. In other words, in the center area of the chamber, reaction products that can be a hindrance to the plasma processing are much present. This reaction products can be efficiently removed by the source gas flowing from the central side toward the outer peripheral side of the chamber as described above. Therefore, the plasma processing is unlikely to be hindered by the reaction products.

The cover may have on the lower surface a protrusion provided between the first gas hole and the second gas hole. According to this configuration, a region in the vicinity of the exit of the first gas hole and a region in the vicinity of the exit of the second gas hole are separated from each other. These are the regions where electrons and radicals are generated during plasma processing, but across the regions separated from each other, the diffusion of the electrons and radicals is unlikely to occur. Therefore, the independent controllability of the first induction coil and the second induction coil can be enhanced, and the controllability of the electron density distribution and the radical density distribution in the chamber can be further enhanced. The protrusion may extend along the circumferential direction of the chamber, and in particular, may be formed in a ring shape. The ring-shaped protrusion may be formed continuously or intermittently. The protrusion desirably has a constant height, but may be uneven in height. The protrusion may be provided so as to overlap the aforementioned second annular region which is defined between the circular region and the first annular region and faces neither the first gas hole nor the second gas hole.

Figure 7A:
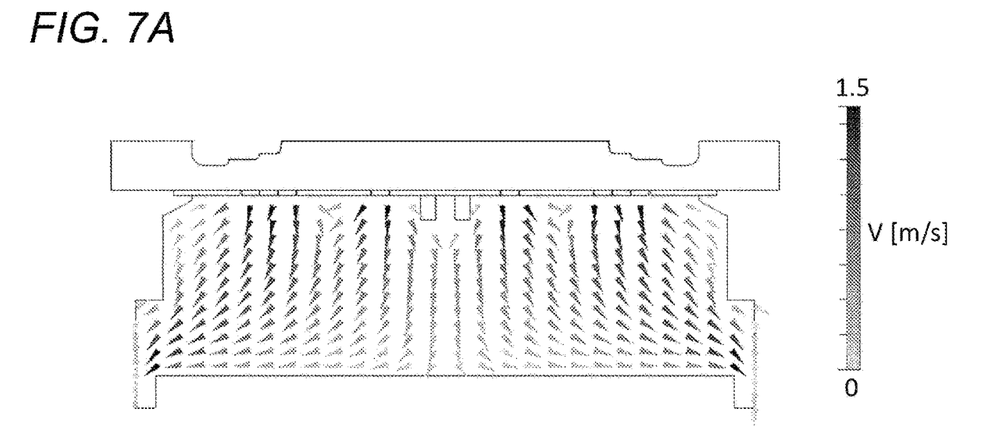
FIG. 7A shows a simulation result when a gas is supplied from a first gas hole and a second gas hole.
Figure 7B:
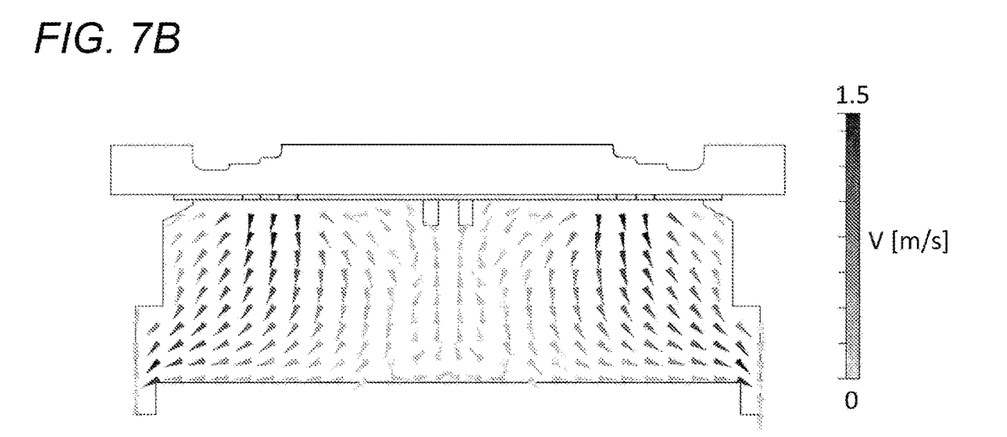
FIG. 7B shows a simulation result when a gas is supplied from the second gas hole only.

With such a protrusion, in some cases, turbulence may occur in the gas flow below the protrusion. However, by supplying a source gas into the chamber not only from the second gas hole but also from the first gas hole, the occurrence of turbulence in the gas flow can be suppressed. Here, examples of a gas flow simulation result are shown in FIGS. 7A and 7B. FIG. 7B shows a simulation result of the gas flow in the chamber provided with a protrusion, when a gas is supplied from the second gas holes only, without being supplied from the first gas holes. A tendency was observed that part of the gas supplied from the second gas holes flows on the stage surface from the peripheral side toward the central side, and then, flows upward around the center of the stage. FIG. 7A shows a simulation result of the gas flow in the chamber provided with a protrusion, when a gas is supplied from both the first gas holes and the second gas holes. The gas flow as observed in FIG. 7B, i.e., the gas flow from the peripheral side toward the central side on the stage surface, and the gas flow moving upward around the center of the stage, was not observed in FIG. 7A, indicating that the occurrence of turbulence in the gas flow is suppressed. This indicates that by supplying a gas from both the first and second gas holes in the chamber provided with a protrusion as shown in FIG. 7A, the gas exhaust characteristics, further the machining speed and machining shape, can be improved, especially around the center of the stage.

The first gas introduction path and the second gas introduction path may be separated from each other. According to this configuration, the entry of the source gas in the first gas introduction path into the second gas introduction path, and the entry of the source gas in the opposite direction can be suppressed. This makes it easy to control the flow rate of the source gas in each of the first and second gas introduction paths. Therefore, in the center area and an area outside the center area in the chamber, the amount of electrons and radicals to be generated can be easily controlled.

The plasma processing apparatus may further include a support member installed above the dielectric member, and a metal cover supporting the support member and covering the first and second induction coils. The first induction coil may have a first end at which a high-frequency power is to be applied, and a second end that is grounded. The second end may be electrically connected to the metal cover via a conductive member supported by the support member, and the chamber may be electrically connected to the metal cover and grounded. The support member may be constituted of an electrical insulator. The conductive member may be integrated with or separate from the second induction coil. According to this configuration, the second end of the first induction coil is grounded via the conductive member, the metal cover and the chamber. The grounding route does not run near the second induction coil. Therefore, mutual interference is unlikely to occur between the first induction coil and the second induction coil. Thus, the independent controllability of the first induction coil and the second induction coil can be enhanced, and the controllability of the electron density distribution and the radical density distribution in the chamber can be further enhanced.

The second induction coil may be formed in a spiral shape extending along the circumferential direction of the chamber. The conductive member may be formed in a plate shape having a first principal surface and a second principal surface opposite to the first principal surface (e.g., a plate shape having a rectangular cross section), and may be provided such that the first and second principal surfaces extend along the radial direction of the chamber. According to this configuration, the magnetic field generated by the second induction coil is unlikely to interlink with the conductive member. Therefore, mutual interference is unlikely to occur between the first induction coil and the second induction coil. Thus, the independent controllability of the first induction coil and the second induction coil can be enhanced, and the controllability of the electron density distribution and the radical density distribution in the chamber can be further enhanced.

At least part of the second induction coil may be disposed in a recess formed in the upper surface of the dielectric member. According to this configuration, at least part of the magnetic field generated by the second induction coil acts on the source gas introduced from the second gas introduction path, via a portion where the recess is formed (i.e., a thin portion) of the dielectric member. Thus, a plasma containing the source gas can be generated with high efficiency by the second induction coil.

(Method for Using Plasma Processing Apparatus)

A method for using a plasma processing apparatus according to the present disclosure is for using the above-described plasma processing apparatus and includes a step of generating a plasma containing a source gas in the chamber, by introducing the source gas into the first and second gas introduction paths and applying a high-frequency power to the first and second induction coils. The method typically includes a step of placing an object to be processed, on the stage, and a step of processing or etching the object to be processed, with the generated plasma. For example, the method may include a step of singulating a semiconductor substrate, which is the object to be processed, by plasma etching. The plasma may be, for example, a plasma containing a fluorine-containing gas, but is not limited thereto. According to the above method, the electron density distribution and the radical density distribution in the chamber can be made uniform.

The flow rate of the source gas introduced into the first gas introduction path may be greater than that introduced into the second gas introduction path. In this case, the reaction products generated abundantly in the center area of the chamber can be efficiently removed by the source gas that flows from the center toward the outer periphery of the chamber. Therefore, the plasma processing is unlikely to be inhibited by the reaction products.

The first gas introduction path and the second gas introduction path may be separated from each other. In this case, the entry of the source gas in the first gas introduction path into the second gas introduction path, and the entry of the source gas in the opposite direction can be suppressed. This makes it easy to control the flow rate of the source gas in each of the first and second gas introduction paths. Therefore, in the center area and an area outside the center area in the chamber, the amount of electrons or radicals to be generated can be easily controlled.

As described above, according to the present disclosure, in the plasma processing apparatus, the electron density distribution and the radical density distribution in the chamber can be made more uniform.

In the following, examples of the plasma processing apparatus and the method for using a plasma processing apparatus according to the present disclosure will be specifically described with reference to the drawings. The components and processes as described above can be applied to the components and processes of the below-described examples of the plasma processing apparatus and the method for using a plasma processing apparatus. The components and processes of the below-described examples of the plasma processing apparatus and the method for using a plasma processing apparatus can be modified based on the description above. The matters as described below may be applied to the above embodiments. Of the components and processes of the below-described examples of the plasma processing apparatus and the method for using a plasma processing apparatus, the components and processes which are not essential to the plasma processing apparatus and the method for using a plasma processing apparatus according to the present disclosure may be omitted. The figures below are schematic and not intended to accurately reflect the shape and the number of the actual members.

Embodiment 1

Figure 1:
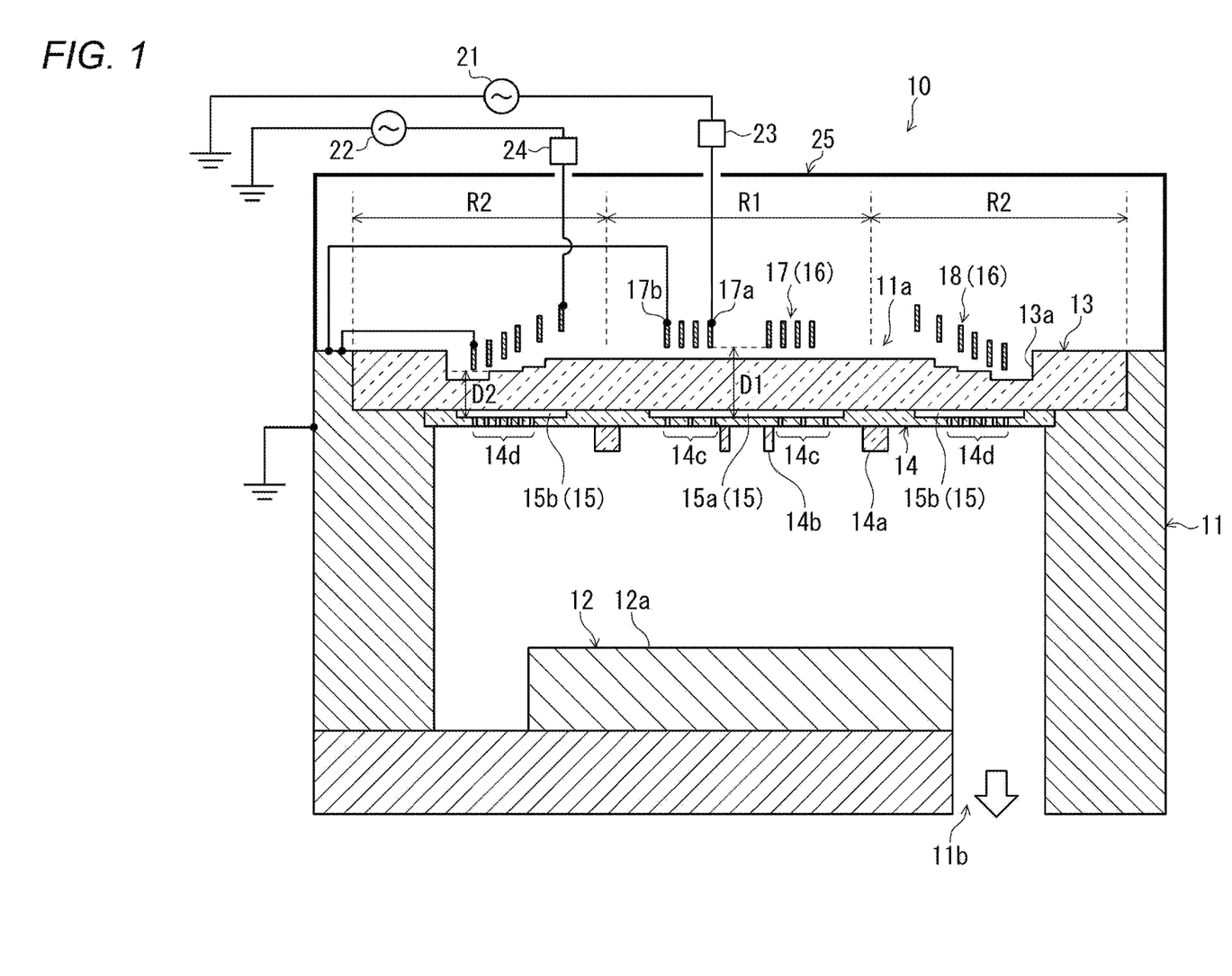
FIG. 1 is a schematic cross-sectional view of a plasma processing apparatus of Embodiment 1.
Figure 2:
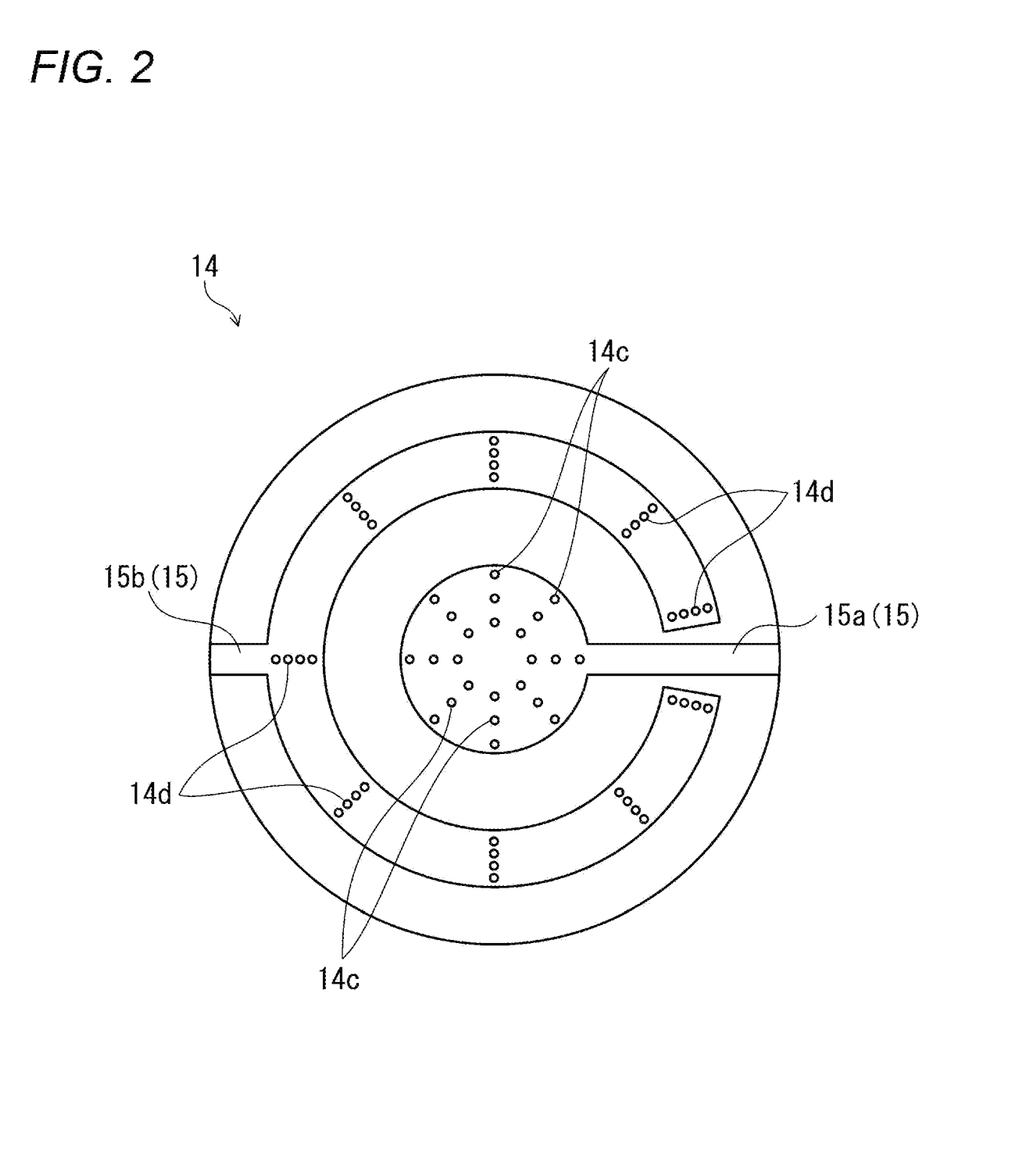
FIG. 2 is a schematic plan view of a cover of Embodiment 1.

Embodiment 1 of the present disclosure will be described. A plasma processing apparatus 10 of the present embodiment is for performing plasma processing on an object to be processed (e.g., a semiconductor substrate). The plasma processing apparatus 10 of the present embodiment is a plasma dicer, but is not limited thereto. As illustrated in FIGS. 1 and 2, the plasma processing apparatus 10 includes a chamber 11, a stage 12, a dielectric member 13, a cover 14, a gas introduction path 15, an induction coil 16, and a first high-frequency power source 21, a second high-frequency power source 22, and a metal cover 25.

The chamber 11 has an opening 11a at the top. The chamber 11 is formed in a hollow cylindrical shape, but is not limited thereto. The opening 11a is open upward. The chamber 11 is provided circumferentially outward from the stage 12, and has an exhaust port 11b for exhausting the source gas used for plasma processing. An exhaust device (not shown) is connected to the exhaust port 11b. The chamber 11 is constituted of a conductive member (e.g., metal). The chamber 11 is grounded.

The stage 12 is provided within the chamber 11, and an object to be processed is placed thereon. The stage 12 has a horizontal placement surface 12a for placing the object to be processed is placed. The stage 12 has a channel (not shown) for flowing a coolant for cooling the object to be processed during plasma processing. The stage 12 has an electrostatic chuck system (not shown) for chucking the object to be processed. The stage 12 has a lower electrode (not shown) to be applied with a high-frequency power.

The dielectric member 13 closes the opening 11a of the chamber 11. The dielectric member 13 is formed in a plate shape having a horizontally extending region. The dielectric member 13 is constituted of quartz, but is not limited thereto.

The cover 14 is installed so as to cover the dielectric member 13 inside the chamber 11. The cover 14 covers the lower surface of the dielectric member 13. The cover 14 includes a plurality of first gas holes 14c formed at positions overlapping a central region R1 of the dielectric member 13, a plurality of second gas holes 14d formed at positions overlapping a peripheral region R2 of the dielectric member 13. The first gas holes 14c and the second gas holes 14d pierce the cover 14 in the thickness direction. The first gas holes 14c and the second gas holes 14d communicate with the space in the chamber 11 where the stage 12 is provided. The plurality of the first gas holes 14c are provided at intervals in the radial direction and in the circumferential direction. The plurality of the second gas holes 14d are provided at intervals in the radial direction and in the circumferential direction. The cover 14 is constituted of aluminum nitride, but is not limited thereto.

The cover 14 has on the lower surface a first protrusion 14a provided between the first gas holes 14c and the second gas holes 14d. The cover 14 has a second protrusion 14b provided inward from the first gas holes 14c. The first and second protrusions 14a and 14b are each formed in a ring shape, but are not limited thereto. The first and second protrusions 14a and 14b are constituted of, for example, aluminum nitride. The first protrusion 14a is one example of the protrusion.

A gas introduction path 15 is formed between the dielectric member 13 and the cover 14, and a source gas is introduced therethrough. The gas introduction path 15 has a first gas introduction path 15a communicating with the first gas holes 14c and a second gas introduction path 15b communicating with the second gas holes 14d. The first gas introduction path 15a and the second gas introduction path 15b are each constituted of a groove formed in the cover 14. The first gas introduction path 15a and the second gas introduction path 15b each communicate with outside the chamber 11. A gas source (not shown) is connected to each of the first and second gas introduction paths 15a and 15b.

In the present embodiment, the first gas introduction path 15a and the second gas introduction path 15b communicate with outside the chamber 11 via passages (not shown) formed in the chamber 11. The first gas introduction path 15a and the second gas introduction path 15b may communicate with outside the chamber 11 via passages (not shown) formed in the dielectric member 13.

The flow rate of the source gas introduced into the first gas introduction path 15a is greater than that introduced into the second gas introduction path 15b. The former flow rate may be smaller than or equal to the latter flow rate. The first gas introduction path 15a and the second gas introduction path 15b are separated from each other.

The induction coil 16 is provided above the dielectric member 13, and when applied with a high-frequency power, generates a plasma containing the source gas in the chamber 11. The induction coil 16 is constituted of a first induction coil 17 provided so as to overlap the central region R1 of the dielectric member 13 and a second induction coil 18 provided so as to overlap the peripheral region R2 of the dielectric member 13. The first induction coil 17 is provided above the central region R1 of the dielectric member 13. The second induction coil 18 is provided above the peripheral region R2 of the dielectric member 13.

The first induction coil 17 is constituted of one or more conductors each spirally extending in the circumferential direction of the chamber 11. The second induction coil 18 is constituted of one or more conductors each spirally extending in the circumferential direction of the chamber 11.

The number of the conductors constituting the first induction coil 17 may be one or more, preferably two. This is for the following reasons. First, the coil length of the first induction coil 17 is shorter than that of the second induction coil 18, and the impedance thereof is smaller than that of the second induction coil 18. Therefore, there is a possibility that high frequencies are superimposed between the coils. In order to prevent the superimposition of high frequencies between the coils, it is desirable to increase the distance between the coils, and change the height position of the action points of the coils, and in addition, to bring the impedances of the coils closer to each other. Secondly, when the number of turns of the first induction coil 17 is one, non-uniform distribution may occur in the circumferential direction. For these reasons, for example, given that the number of turns of the second induction coil 18 is four, the number of turns of the first induction coil 17 is preferably less than four, such as two. In other words, the number of the conductors constituting the first induction coil 17 is preferably two or more, and smaller than the number of the conductors forming the second induction coil 18.

A first distance D1 between the first induction coil 17 and the first gas holes 14c (specifically, the distance between the lower end of the first induction coil 17 and the upper ends of the first gas holes 14c) is longer than a second distance D2 between the second induction coil 18 and the second gas holes 14d (specifically, the distance between the lower end of the second induction coil 18 and the upper ends of the second gas holes 14d). For example, the first distance D1 may be 1.3 times or more and 3 times or less as large as the second distance D2. The first distance D1 may be shorter than or equal to the second distance D2. Part of the second induction coil 18 (part on the outer peripheral side) is disposed in a recess 13a formed in the upper surface of the dielectric member 13.

The first high-frequency power source 21 supplies a high-frequency power (e.g., an AC power of 3 to 30 MHz) to the first induction coil 17. The first high-frequency power source 21 is connected to one end (first end 17a) of the first induction coil 17 via a first matcher 23, such as a variable capacitor. The other end (second end 17b) of the first induction coil 17 is grounded via the electrically conductive chamber 11.

The second high-frequency power source 22 supplies a high-frequency power (e.g., an AC power of 3 to 30 MHz) to the second induction coil 18. The second high-frequency power source 22 is connected to one end of the second induction coil 18 via a second matcher 24, such as a variable capacitor. The other end of the second induction coil 18 is grounded via the electrically conductive chamber 11.

The frequency of the power of the first high-frequency power source 21 (the power applied to the first induction coil 17) and the frequency of the power of the second high-frequency power source 22 (the power applied to the second induction coil 18) are different from each other. The two frequencies may be equal to each other.

The method of supplying a high-frequency power to the first induction coil 17 and the second induction coil 18 is not limited thereto. For example, using one high-frequency power source, with a high-frequency divider circuit connected to the output part of the matcher, a high-frequency power may be applied in a desired ratio to the first induction coil 17 and the second induction coil 18.

The metal cover 25 covers the first induction coil 17 and the second induction coil 18. The metal cover 25 is provided in the upper area of the chamber 11 and electrically connected to the chamber 11. The metal cover 25 is formed in a cylindrical shape with a closed upper end, but is not limited thereto. The metal cover 25 may be constituted of, for example, aluminum.

—Method for Using Plasma Processing Apparatus—

A method for using a plasma processing apparatus of the present embodiment will be described. The method is for using the above-described plasma processing apparatus 10, and includes a step of generating a plasma containing a source gas in the chamber 11, by introducing the source gas into the first and second gas introduction paths 15a and 15b and applying a high-frequency power to the first and second induction coils 17 and 18.

Embodiment 2

Figure 3:
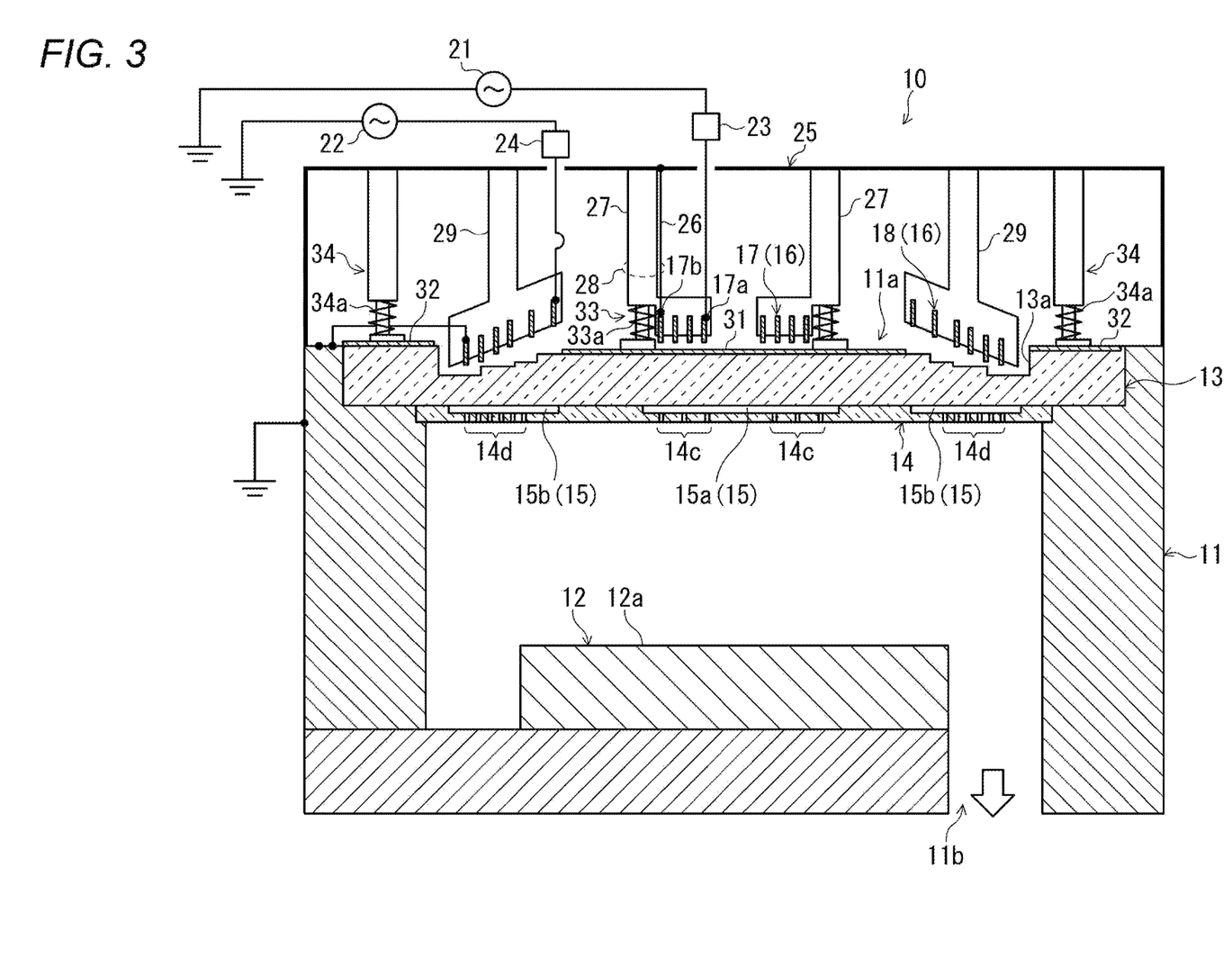
FIG. 3 is a schematic cross-sectional view of a plasma processing apparatus of Embodiment 2.

Embodiment 2 of the present disclosure will be described. The plasma processing apparatus 10 of the present embodiment differs from that of Embodiment 1 in that a first support member 27 and the like are included. In the following, the difference from Embodiment 1 will be mainly described.

Figure 4:
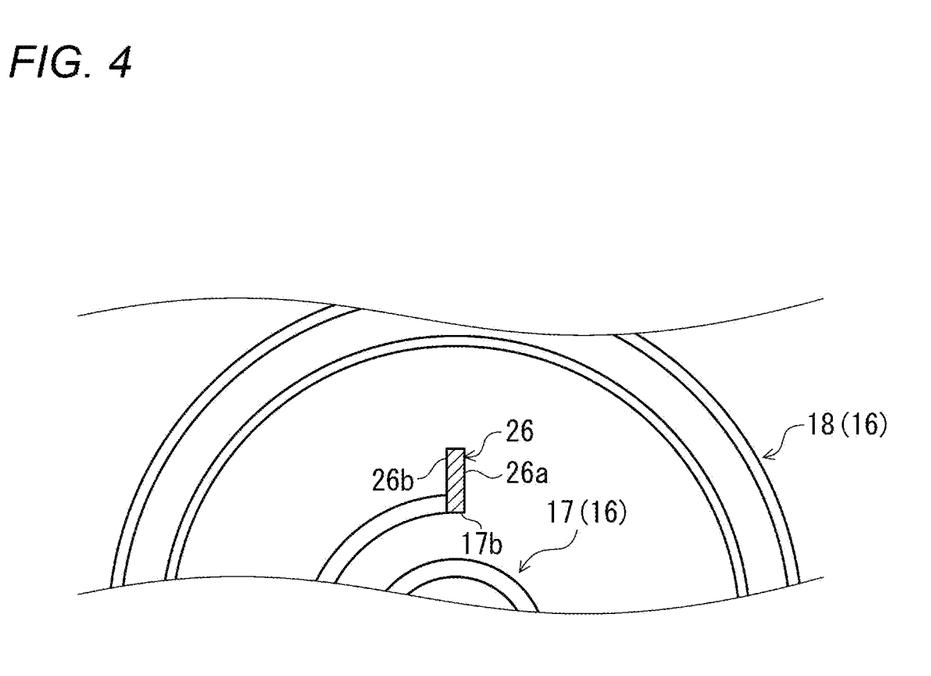
FIG. 4 is a schematic partial plan view of induction coils of Embodiment 2.

As illustrated in FIGS. 3 and 4, the plasma processing apparatus 10 includes the first support member 27, a second support member 29, a first heater 31, a second heater 32, a first pressing part 33, and a second pressing part 34.

The first support member 27 is installed above the central region R1 of the dielectric member 13. The first support member 27 is constituted of an electrical insulator. The first support member 27 is supported by the metal cover 25. The first support member 27 supports the first induction coil 17.

The first support member 27 supports a conductive member 26 connected to the second end 17b of the first induction coil 17 via a fixing member 28. The conductive member 26 is electrically connected to the metal cover 25 above the first induction coil 17. The conductive member 26 does not extend into a region above the second induction coil 18. The first support member 27 is one example of the support member.

The second support member 29 is installed above the peripheral region R2 of the dielectric member 13. The second support member 29 is constituted of an electrical insulator. The second support member 29 is supported by the metal cover 25. The second support member 29 supports the second induction coil 18.

The first heater 31 and the second heater 32 for heating the dielectric member 13 during plasma processing are provided on the upper surface of the dielectric member 13. The first heater 31 is provided closer to the center than the second heater 32.

The first pressing part 33 and the second pressing part 34 press the first heater 31 and the second heater 32 against the dielectric member 13. The first pressing part 33 is provided between the first support member 27 and the first heater 31. The first pressing part 33 has a first spring 33a for pressing the first heater 31 against the dielectric member 13. The second pressing part 34 is provided between the metal cover 25 and the second heater 32. The second pressing part 34 has a second spring 34a for pressing the second heater 32 against the dielectric member 13.

As shown in FIG. 4, the conductive member 26 is formed in a plate shape having a first principal surface 26a and a second principal surface 26b opposite to the first principal surface 26a. The conductive member 26 is provided such that first and second principal surfaces 26a and 26b extend along the radial direction of the chamber 11. For example, the conductive member 26 may be provided such that imaginary straight lines drawn along the first and second principal surfaces 26a and 26b are substantially orthogonal to the side surface of the spirally-shaped second induction coil 18. Being substantially orthogonal means being intersecting at an angle of 80° or more and 100° or less.

Embodiment 3

Figure 5:
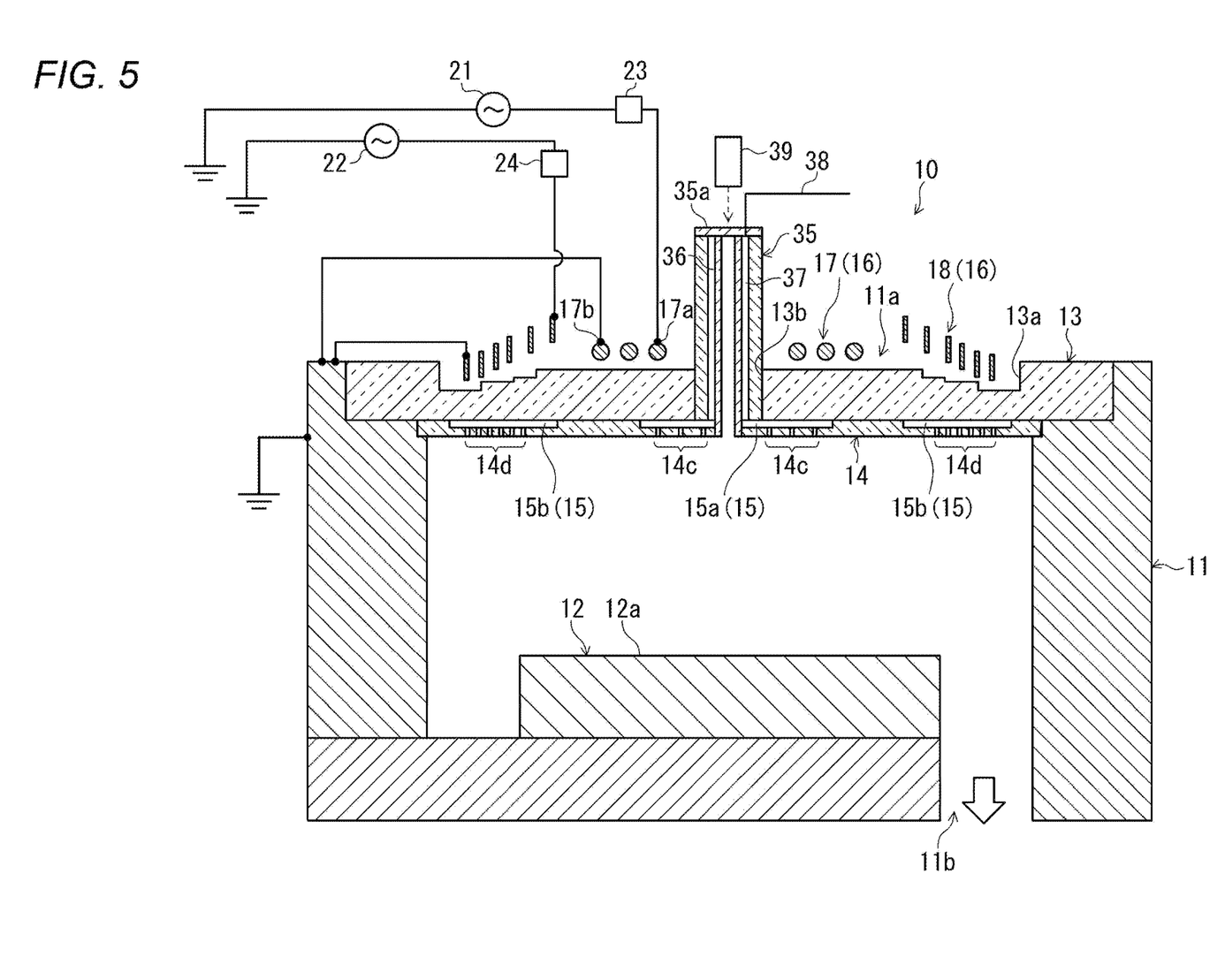
FIG. 5 is a schematic cross-sectional view of a plasma processing apparatus of Embodiment 3.

Embodiment 3 of the present disclosure will be described. The plasma processing apparatus 10 of the present embodiment differs from that of Embodiment 1 in that a projection 35 and the like are included. In the following, the difference from Embodiment 1 will be mainly described.

As illustrated in FIG. 5, the plasma processing apparatus 10 has the projection 35, a tubular member 36, and an optical sensor 39.

The projection 35 is fitted into a through-hole 13b formed at the center of the dielectric member 13 and extends more upward than the dielectric member 13. The projection 35 has at the upper end a dielectric window 35a for optical measurement. The dielectric window 35a transmits light emitted by or from the optical sensor 39, the object to be processed placed on the stage 12, or the plasma. The projection 35 may be constituted of a dielectric, or may be constituted of another material.

The tubular member 36 is provided so as to extend vertically inside the projection 35. The tubular member 36 is constituted of a dielectric. A gas introduction space 37 communicating with the first gas introduction path 15a is formed between the tubular member 36 and the projection 35. A source gas is introduced into the gas introduction space 37 from a gas source (not shown) through a gas pipe 38.

The optical sensor 39 for detecting information on the object to be processed is provided above the dielectric window 35a. The optical sensor 39 detects the information on the object to be processed by irradiating a light onto the object to be processed, through the dielectric window 35a, and receiving the light reflected from the object. The optical sensor 39 may detect the information on the object to be processed, by receiving a light emitted by the object to be processed, through the dielectric window 35a. The optical sensor 39 may detect the information on the object to be processed and the plasma, by receiving a light emitted by the plasma, through the dielectric window 35a. The optical sensor 39 is constituted of, for example, an infrared sensor, but is not limited thereto. The information on the object to be processed is, for example, the thickness of at least part of the object to be processed and/or the temperature of the object to be processed. The information on the plasma is, for example, the composition of the plasma.

The present disclosure is applicable to a plasma processing apparatus and a method for using a plasma processing apparatus.

REFERENCE NUMERALS

10: plasma processing apparatus
11: chamber
11a: opening
11b: exhaust port
12: stage
12a: placement surface
13: dielectric member
13a: recess
13b: through-hole
14: cover
14a: first protrusion (protrusion)
14b: second protrusion
14c: first gas hole
14d: second gas hole
15: gas introduction path
15a: first gas introduction path
15b: second gas introduction path
16: induction coil
17: first induction coil
17a: first end
17b: second end
18: second induction coil
21: first high-frequency power source
22: second high-frequency power source
23: first matcher
24: second matcher
25: metal cover
26: conductive member
26a: first principal surface
26b: second principal surface
27: first support member (support member)
28: fixing member
29: second support port
31: first heater
32: second heater
33: first pressing part
33a: first spring
34: second pressing part
34a: second spring
35: projection
35a: dielectric window 36: tubular member
37: gas introduction space
38: gas pipe
39: optical sensor
D1: first distance
D2: second distance
R1: central region
R2: peripheral region

What is claimed is:

1. A plasma processing apparatus, comprising:
a chamber having an opening at a top;
a stage provided in the chamber, the stage for placing an object to be processed;
a dielectric member closing the opening;
a cover installed so as to cover the dielectric member inside the chamber;
a gas introduction path formed between the dielectric member and the cover, the gas introduction path for introducing a source gas; and
an induction coil provided above the dielectric member and configured to, when applied with a high-frequency power, generate a plasma containing the source gas in the chamber,
the induction coil including a first induction coil installed so as to overlap a central region of the dielectric member, and a second induction coil installed so as to overlap a peripheral region outside the central region of the dielectric member,
the cover having a first gas hole formed at a position overlapping the central region of the dielectric member and a second gas hole formed at a position overlapping the peripheral region of the dielectric member,
the gas introduction path having a first gas introduction path communicating with the first gas hole and a second gas introduction path communicating with the second gas hole.

2. The plasma processing apparatus according to claim 1, wherein a first distance between the first gas hole and the first induction coil is different from a second distance between the second gas hole and the second induction coil.

3. The plasma processing apparatus according to claim 1, wherein a flow rate of the source gas introduced into the first gas introduction path is higher than a flow rate of the source gas introduced into the second gas introduction path.

4. The plasma processing apparatus according to claim 1, wherein the cover has on a lower surface a protrusion provided between the first gas hole and the second gas hole.

5. The plasma processing apparatus according to claim 1, wherein the first gas introduction path and the second gas introduction path are separated from each other.

6. The plasma processing apparatus according to claim 1, further comprising:
a support member installed above the dielectric member; and
a metal cover supporting the support member and covering the first and second induction coils; wherein
the first induction coil has a first end at which a high-frequency power is to be applied and a second end that is grounded,
the second end is electrically connected to the metal cover via a conductive member supported by the support member, and
the chamber is electrically connected to the metal cover and grounded.

7. The plasma processing apparatus according to claim 6, wherein
the second induction coil is formed in a spiral shape extending along a circumferential direction of the chamber, and
the conductive member is formed in a plate shape having a first principal surface and a second principal surface opposite to the first principal surface, and the first and second principal surfaces are arranged so as to extend along a radial direction of the chamber.

8. A method for using a plasma processing apparatus, the plasma processing apparatus including:
a chamber having an opening at a top;
a stage provided in the chamber, the stage for placing an object to be processed;
a dielectric member closing the opening;
a cover installed so as to cover the dielectric member inside the chamber;
a gas introduction path formed between the dielectric member and the cover; and
an induction coil provided above the dielectric member,
the induction coil including a first induction coil installed so as to overlap a central region of the dielectric member, and a second induction coil installed so as to overlap a peripheral region outside the central region of the dielectric member,
the cover having a first gas hole formed at a position overlapping the central region of the dielectric member and a second gas hole formed at a position overlapping the peripheral region of the dielectric member,
the gas introduction path having a first gas introduction path communicating with the first gas hole and a second gas introduction path communicating with the second gas hole, the method comprising:
generating a plasma containing a source gas in the chamber, by introducing the source gas into the first and second gas introduction paths and applying a high-frequency power to the first and second induction coils.

9. The method for using a plasma processing apparatus according to claim 8, wherein a flow rate of the source gas introduced into the first gas introduction path is higher than a flow rate of the source gas introduced into the second gas introduction path.

10. The method for using a plasma processing apparatus according to claim 8, wherein the first gas introduction path and the second gas introduction path are separated from each other.

* * * * *